United States Patent
Makiej

(10) Patent No.: US 9,820,399 B1
(45) Date of Patent: Nov. 14, 2017

(54) KEY FOB WITH INTERNAL PRESSURE MANAGEMENT DIAPHRAGM

(71) Applicant: Continental Automotive Systems, Inc., Auburn Hills, MI (US)

(72) Inventor: Wojciech A Makiej, Oakland, MI (US)

(73) Assignee: Continental Automotive Systems, Inc., Auburn Hills, MI (US)

( * ) Notice: Subject to any disclaimer, the term of this patent is extended or adjusted under 35 U.S.C. 154(b) by 0 days.

(21) Appl. No.: 15/254,481

(22) Filed: Sep. 1, 2016

(51) Int. Cl.
*H05K 5/06* (2006.01)
*G07C 9/00* (2006.01)
*H05K 5/02* (2006.01)
*H05K 5/03* (2006.01)

(52) U.S. Cl.
CPC ......... *H05K 5/068* (2013.01); *G07C 9/00944* (2013.01); *H05K 5/0217* (2013.01); *H05K 5/03* (2013.01); *H05K 5/061* (2013.01); *G07C 2009/00984* (2013.01)

(58) Field of Classification Search
CPC .. H05K 5/0047; H05K 5/0052; H05K 5/0056; H05K 5/006; H05K 5/06; H05K 5/068
See application file for complete search history.

(56) References Cited

U.S. PATENT DOCUMENTS

| | | | |
|---|---|---|---|
| 9,024,718 B1 * | 5/2015 | Muse | A45F 5/021 340/5.51 |
| 2010/0302025 A1 * | 12/2010 | Script | G01P 15/09 340/539.1 |

* cited by examiner

*Primary Examiner* — Jeremy C Norris

(57) ABSTRACT

A key fob with a pressure-managing diaphragm for an air-tight volume inside the fob comprises a housing that is made up of two portions or sections. At least one portion of the housing has an opening into the air-tight volume. The opening is covered by a flexible diaphragm, which flexes inwardly and outwardly responsive to pressure changes. The diaphragm is protected from damage by a shield extending over it.

18 Claims, 4 Drawing Sheets

KEY FOB WITH INTERNAL PRESSURE MANAGEMENT DIAPHRAGM

BACKGROUND

As used herein, "key fob" refers to a small, wireless security device used to control and secure access to a motor vehicle but it can also be used to control and secure access to a building. A key fob is thus an integral component of keyless entry systems, including those commonly provided to most new cars by vehicle manufacturers. As is known, locking and unlocking a car or a building with a key fob is as easy as pushing a button.

Key fobs are sometimes dropped into water and for that reason, they are preferably manufactured to be air-tight and water-tight. Providing a water-tight and air-tight seal, however, requires a gasket or seal between two halves or portions of a key fob housing, which can be damaged if the internal pressure, i.e. the pressure inside the key fob, changes enough to "blow out" the gasket or seal that provides an air-tight and water-tight enclosure in the key fob housing. A key fob that is able to withstand or "manage" internal pressure fluctuations would be an improvement over the prior art.

DETAILED DESCRIPTION

For clarity purposes, an elastic material is considered herein to any material capable of recovering its size and shape after being deformed. An elastomeric material is considered to be any elastic substance that resembles rubber. A material is considered to be pliable if it is supple enough to bend freely or repeatedly without breaking. A material is considered to be plastic if it is any one of a number of materials that are thermoplastic or thermosetting polymers having a relatively high molecular weight and that can be molded or otherwise formed into an object, such as housings for electronic devices, including a key fob. A hermetic seal is considered herein to be air tight and water tight.

Figure 1:
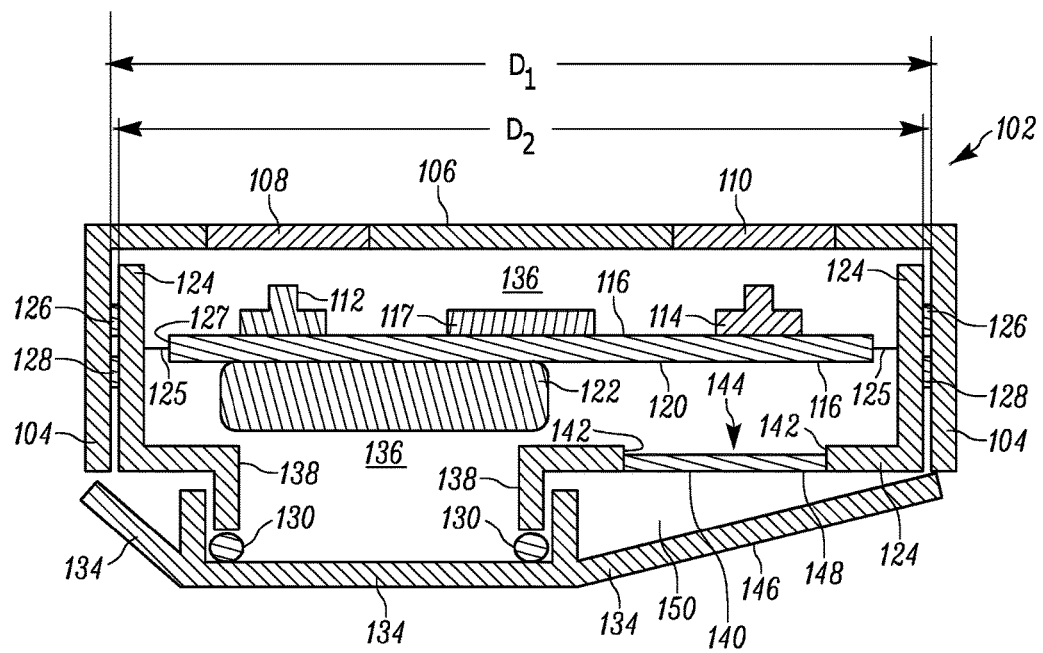
FIG. 1 is a cross-sectional view of a key fob with a diaphragm that provides internal pressure management.

Referring now to FIG. 1, a preferred embodiment of a key fob 100 with an internal pressure management diaphragm is shown in cross-section. The key fob (or simply "fob") 100 comprises a case or housing 102. The housing 102 is made up of a plastic top or first portion 104 having a top side 106 and a plastic bottom or second portion 124. The top portion 104 is formed to include water-tight push buttons 108 and 110.

The push buttons 108, 110 are located directly over corresponding momentary switches 112 and 114. The switches 112, 114 are attached to a conventional printed circuit board 116 on which various electronic devices 117 are mounted. When the push buttons 108 and 110 are depressed, they cause the switches 112 and 114 to be actuated. Actuation of the push buttons 112, 114 causes a radio frequency transmitter, formed into an integrated circuit 117, to emit a signal. When such a signal is received by a mating receiver, not shown, the receiver causes a door opener, door lock or other device, also not shown, to operate.

A replaceable, disc-shaped energy source 122, for example an electric cell or battery, is attached to the lower or bottom surface 120 of the circuit board 116. The energy source 122 provides electrical energy to the transmitter and other devices mounted to the circuit board 116. The energy source 122 is placed into an air-tight space 136 formed by the assembly of the first and second portions of the housing 102 and a cover or door 134, which fits over an opening 136 in the second portion 124.

The circuit board 116 is attached to the bottom or second portion 124 of the housing 102 by a plastic support structure 125. The support structure 125, which is not germane to the subject matter claimed hereinafter, extends around the peripheral edge 127 of the circuit board 116 and holds the circuit board in place.

As can be seen in the figure, the second portion 124 of the housing 102 is configured or shaped to fit snugly within (inside) the first portion 104. Both portions 104, 124 of the preferred embodiment are generally cylindrical although the key fob 100 can of course have other shapes.

An inside diameter, D1, of the first portion 104 is slightly larger than the outside diameter, D2, of the second portion 124. The difference between the two diameters forms a somewhat annulus-shaped passageway between the two housing portions 104, 124, through which water can leak into the space 136 if the passageway between the two housing portions is not closed or sealed.

In order to close or seal the volume or space 136 inside the key fob 100, dual gaskets or seals 126 and 128 are attached to the outside of the second portion 124 and fit snugly between mating surfaces of the first and second portions 104, 124. The seals 126 and 128 are made of a pliable material and provide a substantially air-tight seal to the enclosed volume 136.

The energy source 122 can be inserted into and removed from the space 136 enclosed by the first and second portions using a door or cover 134, configured to fit over a cylindrical energy source access port 138 of the second portion 124. A toroid-shaped gasket 130, (shown in cross section) sits "on top of" the top end of the cylindrical access port 138 formed into the second portion 116. When the door 134 is snapped in place, the gasket 130 provides a substantially air-tight and substantially air-tight seal. The seals 126, 128 and the gasket 130 provide an air-tight and pressure-tight seal to the volume 136 enclosed within the first and second portions 104, 124.

The cover 134 and the first portion 104 and second portion 124 are sized, shaped and arranged to enclose a volume 136 which is made substantially water-tight and substantially air-tight, i.e., hermetically sealed, by virtue of seals 126, 128 and 130.

Figure 2:
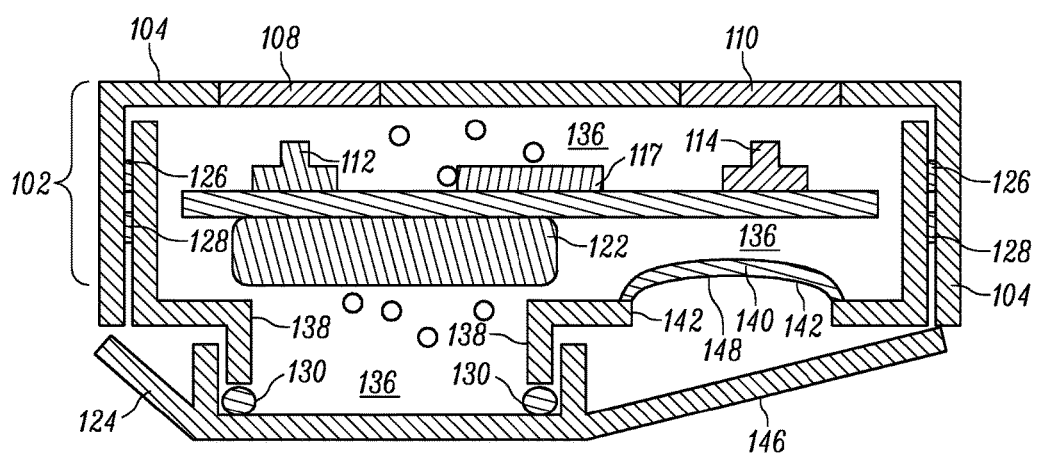
FIG. 2 is a cross-sectional depiction of the key fob shown in FIG. 1 but with the internal pressure reduced below atmospheric pressure due to a decreased temperature.
Figure 3:
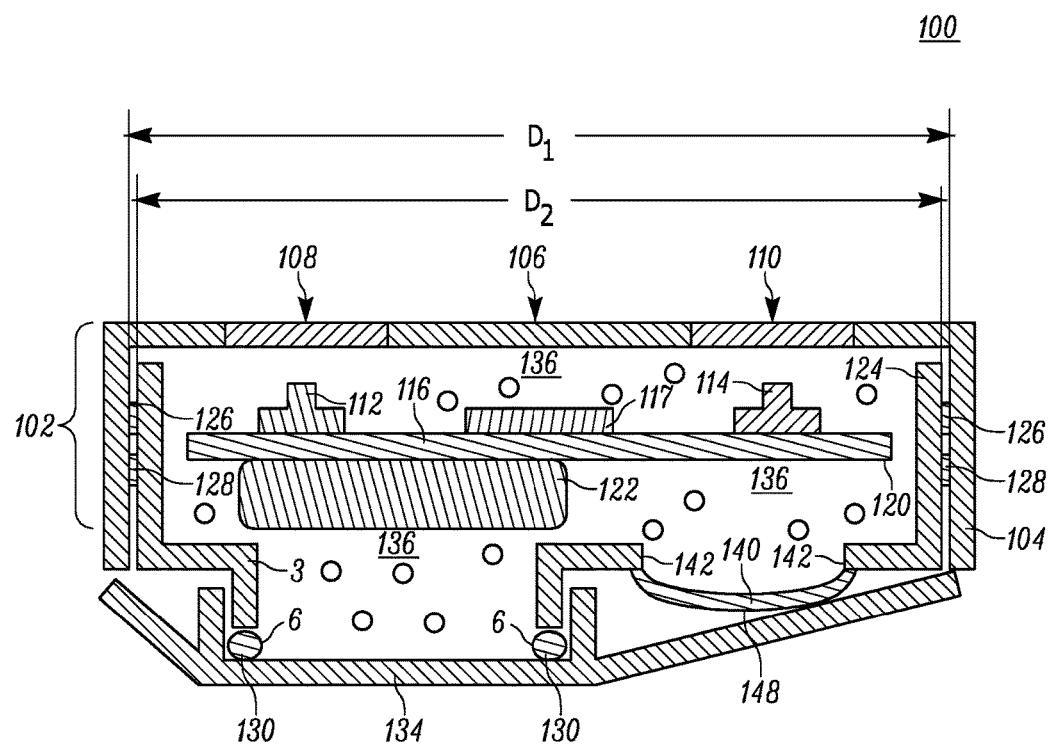
FIG. 3 is a cross-sectional diagram of the key fob shown in FIG. 1 with the internal pressure of the key fob elevated above atmospheric pressure due to an increased temperature.

A problem with prior art key fobs that are at least claimed to be waterproof is that a pressure change inside such a key fob frequently destroys or ruptures the thin seals or gaskets that provide water and air-tight seals. In the key fob 100 shown in the figures, an internal-pressure-management diaphragm 140, made of a pliable or elastomeric material, is glued or otherwise attached to peripheral edges 142 of an opening 144 that is formed into at least one side or portion of the housing 102 from which the key fob 100 is made. The diaphragm 140, being made of a pliable or elastomeric material, deflects responsive to differences between the pressure inside the enclosed volume 136 and ambient pressure. When the pressure inside the key fob 100 drops below ambient pressure, the diaphragm 140 deflects inwardly, as shown in FIG. 2. When pressure inside the key fob 100 is greater than the ambient pressure, the diaphragm deflects outwardly, as shown in FIG. 3. The diaphragm 140 thus allows pressure in the key fob 100 to stay equal or substantially equal to pressure outside the key fob 100.

When the temperature of air or other gas in the enclosed volume 136 drops or falls, the pressure inside the enclosed volume 136 also drops or falls relative to atmospheric (ambient) pressure. When the interior pressure drops relative to ambient pressure, the diaphragm 140 deflects inwardly as shown in FIG. 2.

When the temperature of air or other gas in the enclosed volume 136 rises or increases, the pressure inside the enclosed volume 136 also rises or increases relative to atmospheric (ambient) pressure. When the interior pressure increases relative to ambient pressure, the diaphragm 140 deflects outwardly as shown in FIG. 3. FIGS. 2 and 3 thus depict the key fob shown in FIG. 1 but with the pressure diaphragm 140 deflected inward and outward respectively, due to the pressure in the enclosed volume 136 decreasing and increasing respectively. The diaphragm 140 over the opening 144 thus controls or manages pressure inside the key fob 100. The diaphragm 140 keeps the pressure in volume 136 enclosed by the key fob portions, and which is hermetically sealed, substantially equal to atmospheric pressure effectively eliminating a pressure-induced gasket or seal failure.

Figure 4:
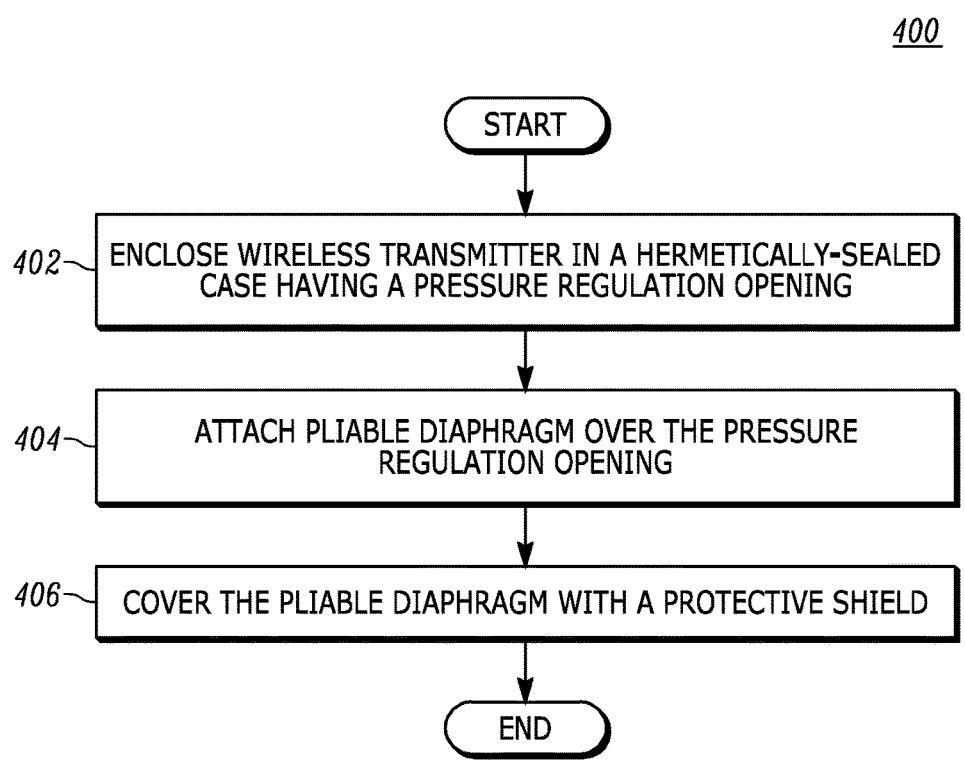
FIG. 4 depicts steps of a method for providing pressure regulation to a key fob.

FIG. 4 depicts steps of a simple method 400 for providing internal pressure management to a key fob. Inasmuch as a port or physical opening through a surface of the key fob 100 housing 102 is important, the first step 402 requires enclosing a wireless transmitter inside a housing that is capable of being hermetically sealed, but which also has an opening, i.e., a pressure regulation opening, into an enclosed volume. Such an opening is depicted in FIGS. 1-3 and identified by reference numeral 144.

As a second step 404, an opening into an enclosed volume is covered or sealed by a flexible or pliable diaphragm or film. The deflection or excursion of a pliable diaphragm keeps the pressure inside the key fob equal to, or at least substantially equal to, atmospheric pressure.

As a third and optional step 404, the diaphragm added at step 402 is covered with a protective shield.

Referring again to FIGS. 1-3, the door 134 has an inclined and substantially planar or flat section 146, which extends over the outward-facing surface 148 of the diaphragm 140. The door 134 is thus sized, shaped and arranged to allow the energy source 122 to be inserted and removed from inside the enclosed volume 136 but to also provide a protective surface or shield 146 over the pressure-managing diaphragm 140. The shield 146 covers and effectively protects the diaphragm 140 from mechanical damage that might be sustained if the diaphragm were to be left exposed. The shield 146 also defines a closed but vented-to-the atmosphere volume 150 above the diaphragm 140.

In the preferred embodiment the diaphragm 140 is preferably made from silicone but can also be made instead from any elastomeric or pliable substance. It is important however, that the diaphragm 140 be mechanically attached to the circumferential edges 142 of the opening 144 in such a way that the integrity of the seal around the enclosed volume 136 is maintained during excursions of the diaphragm in order for the diaphragm to preserve a water-tight and air-tight environment inside the fob 100.

The housing 102, its first and second portions 104 and 124 and door 134 as can be made from any suitable plastic material. A pressure-relieving opening 144 into the enclosed volume 136 can be located on any surface of either the first portion 104 or the second portion 124. The diaphragm can be made of any pliable material including but not limited to silicone and various other pliable materials.

Those of ordinary skill in the mechanical arts should recognize that the apparatus described above and depicted in the drawings can be used with any type of housing for any type of electronic device, individual component or apparatus comprised of electronic devices and components, requiring a water-tight and an air-tight housing, the internal pressure of which needs to be "managed" or controlled. The description provided herein should therefore not be construed to be limited to key fob housings.

The foregoing description is for purposes of illustration only. The true scope of the invention is set forth in the following claims.

What is claimed is:

1. A key fob comprising:
   a housing comprising first and second portions, the first and second portions being sized, shaped and arranged such that when they are attached to each other, they define and enclose a volume, which is substantially air-tight;
   a communications device, inside the substantially air-tight volume;
   an opening formed into the substantially air-tight volume and extending through one of the first and second portions;
   a flexible diaphragm covering the opening and configured to deflect outwardly and inwardly, relative to pressure changes in the substantially air-tight volume relative to ambient pressure.

2. The key fob of claim 1, further comprising a gasket between mating surfaces of the first and second portions, the gasket providing a substantially air-tight seal between the first and second portions.

3. The key fob of claim 1, further comprising a printed circuit board and a energy source, both of which are located inside the substantially air-tight volume.

4. The key fob of claim 3, wherein at least one of the first and second portions comprise a door, the door being sized, shaped and arranged to enable the energy source to be placed into and removed from, the substantially air-tight volume.

5. The key fob of claim 4, wherein the flexible diaphragm has a first side facing into the substantially air-tight volume and a second side facing away from the substantially air-tight volume, the key fob additionally comprising a protective shield extending over the second side of the flexible diaphragm, the protective shield configured to cover and protect the second side of the flexible diaphragm and allow the flexible diaphragm to deflect responsive to pressure changes inside the substantially air-tight volume.

6. The key fob of claim 5, wherein the door also provides said protective shield.

7. The key fob of claim 1, wherein the flexible diaphragm is pliable and provides a substantially air-tight seal over the opening.

8. The key fob of claim 1, wherein the flexible diaphragm is elastomeric and provides a substantially air-tight seal over the opening.

9. The key fob of claim 1, wherein the flexible diaphragm is pliable and provides a substantially hermetic seal.

10. The key fob of claim 1, wherein the flexible diaphragm is sized, shaped and arranged to substantially equalize pressure in the key fob with pressure outside the key fob by deflection of the diaphragm responsive to pressure inside the key fob.

11. A method of managing pressure in a key fob, the method comprising:

enclosing a wireless transmitter in a case, capable of being hermetically sealed and which is configured to have a pressure regulation opening; and attaching a pliable diaphragm over the pressure regulation opening.

12. The method of claim 11, further comprising:

covering the pliable diaphragm with a protective shield.

13. The method of claim 11, wherein deflection of the pliable diaphragm equalizes pressure in the key fob with pressure outside the key fob.

14. A housing comprising:

first and second portions, sized, shaped and arranged such that when they are attached to each other, they define and enclose a volume, which is substantially air-tight;

an electronic device, inside the substantially air-tight volume;

an opening formed into the substantially air-tight volume and extending through one of the first and second portions;

a flexible diaphragm covering the opening and configured to deflect outwardly and inwardly, relative to pressure changes in the substantially air-tight volume relative to ambient pressure.

15. The housing of claim 14, further comprising a gasket between mating surfaces of the first and second portions, the gasket providing a substantially air-tight seal between the first and second portions.

16. The housing of claim 14, further comprising a printed circuit board and a energy source, both of which are located inside the substantially air-tight volume.

17. The housing of claim 16, wherein at least one of the first and second portions comprise a door, the door being sized, shaped and arranged to enable the energy source to be placed into and removed from, the substantially air-tight volume.

18. The housing of claim 14, wherein the flexible diaphragm has a first side facing into the substantially air-tight volume and a second side facing away from the substantially air-tight volume, the housing additionally comprising a protective shield extending over the second side of the flexible diaphragm, the protective shield configured to cover and protect the second side of the flexible diaphragm and allow the flexible diaphragm to deflect responsive to pressure changes inside the substantially air-tight volume.

* * * * *